United States Patent
Tiller et al.

(10) Patent No.: US 10,418,973 B2
(45) Date of Patent: Sep. 17, 2019

(54) DC CONTROL CIRCUIT FOR CONTROLLING RESISTANCE OF A RF TRANSISTOR

(71) Applicants: Samuel Alfred Tiller, Ottawa (CA); Kimia Taghizadeh Ansari, Ottawa (CA); Tyler Neil Ross, Ottawa (CA)

(72) Inventors: Samuel Alfred Tiller, Ottawa (CA); Kimia Taghizadeh Ansari, Ottawa (CA); Tyler Neil Ross, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 118 days.

(21) Appl. No.: 15/808,603

(22) Filed: Nov. 9, 2017

(65) Prior Publication Data

US 2019/0140623 A1 May 9, 2019

(51) Int. Cl.
H03H 11/24 (2006.01)
H03G 3/30 (2006.01)
H03F 3/19 (2006.01)

(52) U.S. Cl.
CPC ............ *H03H 11/245* (2013.01); *H03F 3/19* (2013.01); *H03F 2200/451* (2013.01); *H03G 3/3042* (2013.01)

(58) Field of Classification Search
CPC .... H03H 11/24; H03H 11/245; H03G 3/3036; H03G 3/3042
See application file for complete search history.

(56) References Cited

U.S. PATENT DOCUMENTS

| | | | | |
|---|---|---|---|---|
| 4,975,604 A | * | 12/1990 | Barta | .................. H03H 11/245 327/308 |
| 7,521,980 B2 | * | 4/2009 | Koen | ..................... H03G 1/007 327/308 |
| 7,663,420 B2 | * | 2/2010 | Araki | .................. H01L 27/0802 327/108 |

(Continued)

FOREIGN PATENT DOCUMENTS

CN 103427780 A 12/2013

OTHER PUBLICATIONS

Xiao, J. et al., "A High Dynamic Range Cmos Variable Gain Amplifier for Mobile DTV Tuner", IEEE Journal of Solid-State Circuits, vol. 42, No. 2, pp. 292-301, Feb. 2007.

(Continued)

*Primary Examiner* — Patrick O Neill

(57) ABSTRACT

A control circuit is disclosed for controlling operation of a radio frequency (RF) transistor. The control circuit has a first sub-circuit that accepts a reference voltage and a reference current. The control circuit has a second sub-circuit with a plurality of stacked transistors coupled between the first sub-circuit and ground, and a resistor ladder coupled between the first sub-circuit and an output port of the control circuit. The first sub-circuit provides the reference current to flow through the stacked transistors, and sets a total voltage drop across the stacked transistors equal to the reference voltage. The first sub-circuit also sets a total voltage drop across the resistor ladder equal to the reference voltage. Each rung of the resistor ladder is coupled to control an operating voltage of a stacked transistor, to cause each stacked transistor to operate with similar control conditions.

22 Claims, 14 Drawing Sheets

(56) References Cited

U.S. PATENT DOCUMENTS

| | | | |
|---|---|---|---|
| 8,624,654 B2* | 1/2014 | Sasho | H03G 1/0088 |
| | | | 327/308 |
| 9,385,687 B2* | 7/2016 | Ellis | H03H 11/245 |
| 10,122,322 B2* | 11/2018 | Lam | H03F 1/0222 |
| 2002/0101287 A1 | 8/2002 | Fowler | |
| 2006/0217078 A1 | 9/2006 | Glass et al. | |
| 2011/0148501 A1 | 6/2011 | Granger-Jones et al. | |
| 2012/0319755 A1 | 12/2012 | Zhang | |
| 2017/0244388 A1 | 8/2017 | Ashry Othman | |
| 2018/0287589 A1* | 10/2018 | Madsen | H03H 11/245 |

OTHER PUBLICATIONS

Kuo, C.-C. et al., "A 71-76 GHz CMOS Variable Gain Amplifier Using Current Steering Technique", 2008 IEEE Radio Frequency Integrated Circuits Symposium, pp. 609-612.

Liu, C. et al., "A 5-Gb/s Automatic Gain Control Amplifier with Temperature Compensation", IEEE Journal of Solid-State Circuits, vol. 47, No. 6, pp. 1323-1333, Jun. 2012.

Liao, C.-F. et al., "A 10Gb/s CMOS AGC Amplifier with 35dB Dynamic Range for 10Gb Ethernet", 2006 IEEE International Solid-State Circuits Conference, Session 28, Wireline Building Blocks, 28.3.

Cho, M.-K. et al., "Wideband Active Bi-directional SiGe Digital Step Attenuator Using an Active DPDT Switch", 2016 IEEE BCTM, pp. 122-125.

Bae, J. et al., "A 10-67-GHz CMOS Dual-Function Switching Attenuator With Improved Flatness and Large Attenuation Range", IEEE Transactions on Microwave Theory and Techniques, vol. 61, No. 12, Dec. 2013, pp. 4118-4129.

* cited by examiner

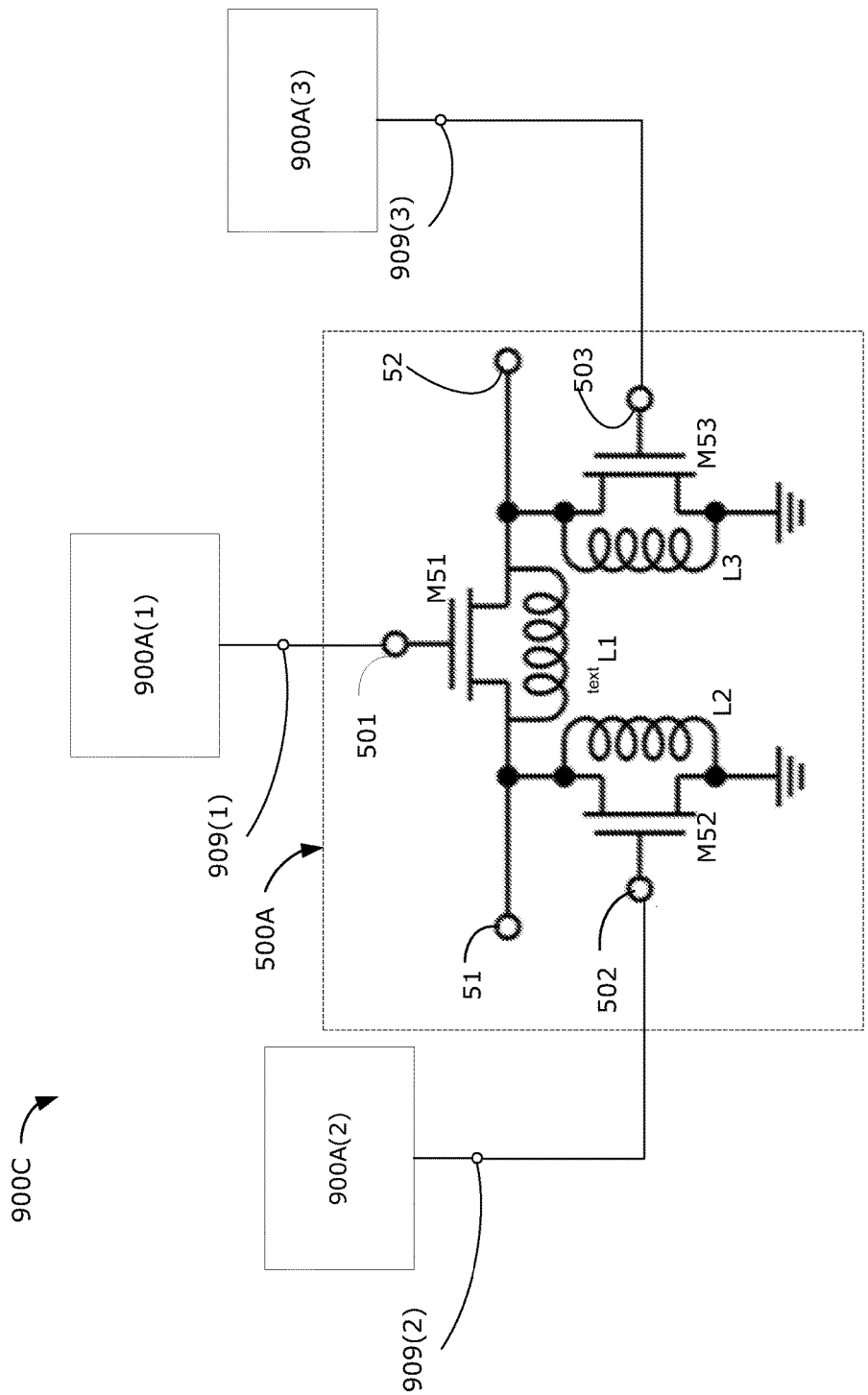

DC CONTROL CIRCUIT FOR CONTROLLING RESISTANCE OF A RF TRANSISTOR

TECHNICAL FIELD

The present disclosure relates to a DC control circuit for controlling resistance of a radio frequency (RF) transistor. The disclosed control circuit in some examples is suitable for use in a RF variable attenuator.

BACKGROUND

A variable-resistance circuit, such as a variable attenuator, can be used to lower voltage, dissipate power and/or improve resistance matching in radio frequency (RF) communication systems.

In receivers, such as those used in various portable electronic devices and/or base stations, it is often necessary to attenuate large received signals before providing the attenuated signal to more sensitive receiver components for proper signal processing. Additionally, in transmitters, such as those used in various portable electronic devices and/or base stations, it is often useful to control the transmitted signal to have less power, in order to avoid excessive interference with other equipment.

In most receivers and transmitters, it is generally desirable to have high linearity and low distortion, particularly over a wide range of signals. Hence, these characteristics are important when designing a variable attenuator for a communication system in which signals are transmitted and received over a large range of power levels.

However, the performance of a variable attenuator may degrade significantly over a high dynamic attenuation range, for example exhibiting a high degree of distortion in the RF communication system. Reasons for such distortion include error in resistance matching between the RF attenuation circuits and DC control circuits that control the amount of variable attenuation. Other than attenuation circuits, other RF circuits may also suffer from such resistance mismatch. For example, phase shifters and variable gain amplifiers are also RF circuits that require control circuits to closely control operation.

Accordingly, solutions for providing an improved variable attenuator are desirable. Further, it would be desirable to provide a control circuit that is suitable for controlling operation of RF circuits, such as attenuation circuits, phase shifters, vector modulators and variable gain amplifiers, among others.

SUMMARY

The present disclosure describes example control circuits to control operation of an RF transistor in a transistor-based circuit, such as a RF transistor used to provide a variable resistance in an attenuation circuit. The example disclosed control circuit uses a plurality of stacked transistors, each operating with the same control conditions, to match resistance between the control circuit and the RF circuit.

Thus, examples described herein may help to address one or both of the challenges of resistance matching and high distortion, in at least some applications.

In some aspects, the present disclosure provides a control circuit for controlling operation of a RF transistor in a transistor-based circuit. The control circuit includes a first sub-circuit. The first sub-circuit includes a first input port to accept a reference voltage, and a second input port to accept a reference current, at least one of the reference voltage or the reference current being adjustable. The control circuit also includes a second sub-circuit. The second sub-circuit includes a plurality of stacked transistors coupled between the first sub-circuit and ground, and a resistor ladder coupled between the first sub-circuit and an output port of the control circuit. The first sub-circuit is coupled to the plurality of stacked transistors to provide the reference current to flow through the plurality of stacked transistors and to set a total voltage drop across the plurality of stacked transistors equal to the reference voltage. The first sub-circuit is coupled to the resistor ladder to set a total voltage drop across the resistor ladder equal to the reference voltage. Each rung of the resistor ladder is coupled to control an operating voltage of a respective one of the plurality of stacked transistors, to cause each stacked transistor to operate with similar control conditions. The output port of the control circuit is coupled to one of the plurality of stacked transistors to provide a control voltage set by one of the plurality of stacked transistors.

In any of the preceding aspects/embodiments, the first sub-circuit may also include a current mirror, a first op amp and a second op amp. The first op amp has a positive input port coupled to the first input port, and an output port coupled to a negative input port of the first op amp in a first feedback loop via the current mirror. The second op amp has a positive input port coupled to the first input port, a negative input port coupled to the second input port, and an output port coupled to the output port of the control circuit. The output port of the second op amp is also coupled to the positive input port of the second op amp in a second feedback loop via the second sub-circuit. The stacked transistors are coupled between the positive input port of the second op amp and ground. The resistor ladder is coupled between an output of the current mirror and the output port of the control circuit.

In any of the preceding aspects/embodiments, the stacked transistors may be triple-well or isolated transistors.

In any of the preceding aspects/embodiments, the plurality of stacked transistors may be field-effect transistors (FETs). The similar control conditions may include: voltages between a gate and a source of each stacked transistor are substantially equal, and voltages between a drain and the source of each stacked transistor are substantially equal.

In any of the preceding aspects/embodiments, the plurality of stacked transistors may be metal-oxide-semiconductor FETs (MOSFETs). The similar control conditions may also include: voltages between a bulk and the source of each stacked transistor are substantially equal.

In any of the preceding aspects/embodiments, at least one of the reference voltage or the reference current may be adjustable to enable the voltage between the drain and the source of each stacked transistor to be close to zero, and current flow across each stacked transistor to be close to zero.

In any of the preceding aspects/embodiments, each rung of the resistor ladder may be connected to a gate of a respective stacked transistor, and the output port of the control circuit may be provided at a gate of an end stacked transistor in the plurality of stacked transistors, where the source of the end stacked transistor is coupled to ground.

In any of the preceding aspects/embodiments, the plurality of stacked transistors may be bipolar transistors. The similar control conditions may include: voltages between a collector and an emitter of each transistor are substantially equal, and voltages between a base and the emitter of each transistor are substantially equal.

In any of the preceding aspects/embodiments, at least one of the reference current or reference voltage may be adjustable to enable the current flow across each stacked transistor to match current flow across the RF transistor and the voltage drop across each stacked transistor to match voltage drop across the RF transistor, to achieve resistance matching with the RF transistor.

In any of the preceding aspects/embodiments, the number of stacked transistors may be 10.

In some aspects, the present disclosure describes a variable attenuator. The variable attenuator includes an attenuation circuit including at least one RF transistor. The at least one RF transistor is controllable to vary attenuation of the attenuation circuit. The variable attenuator also includes at least one control circuit coupled to the at least one RF transistor to provide a control voltage to control operation of the RF transistor, the control circuit being any of the aspects/embodiments of the control circuit described above.

In any of the preceding aspects/embodiments, the attenuation circuit may have a T-type configuration.

In any of the preceding aspects/embodiments, the attenuation circuit may have a Π-type configuration.

In some aspects, the present disclosure describes an apparatus including a transceiver configured to receive or transmit signals, and a variable attenuator configured to attenuate the received or transmitted signals, the variable attenuator being any of the aspects/embodiments of the variable attenuator described above.

BRIEF DESCRIPTION OF THE DRAWINGS

For a more complete understanding of the present invention, and the advantages thereof, reference is now made to the following description taken in conjunction with the accompanying drawings, in which:

FIG. 9C is a schematic diagram of a variable attenuator including a plurality of the control circuits of FIG. 9A according to example embodiments;

Figure 1:
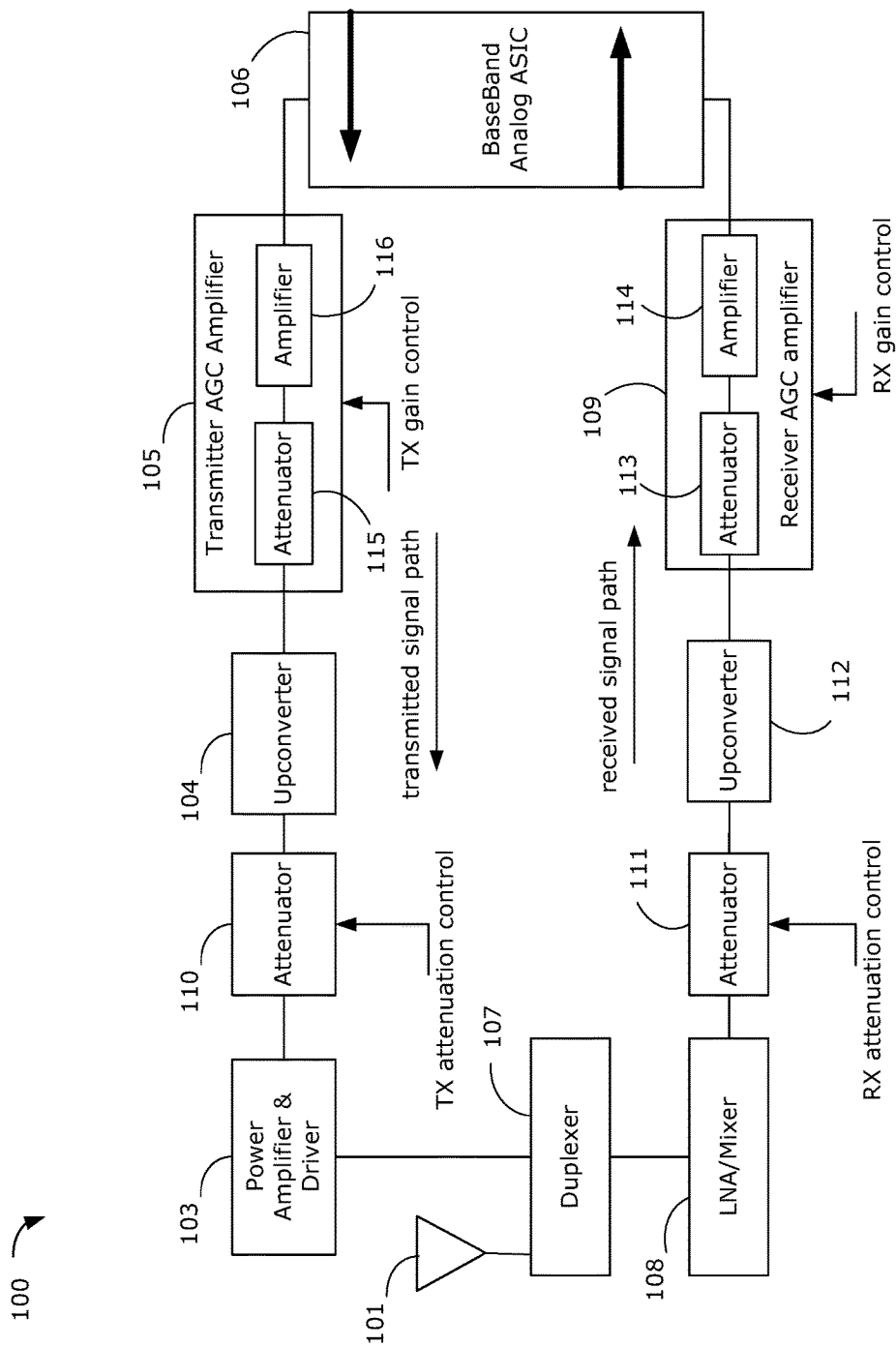
FIG. 1 is a schematic diagram illustrating a transceiver for wireless communication according to example embodiments.

In electronic circuit diagrams, conventional electronic components are labeled with conventional reference letters followed by a number indication the iteration of that element in the circuit. For example, R indicates a resistor, C indicates a capacitor, L indicates an inductor, Q indicates a bipolar junction transistor and M indicates a field-effect transistor. Although examples disclosed herein have been implemented using certain types of components, such as certain types of transistors, it should be understood that these are illustrative only. For example, different types of transistors may be used and/or different types of loads may be used. Each electronic component has a plurality of terminal through which it is connected to wires and other components. However, the use of the word "terminal" does not imply an implementation based on discrete components only, and any circuit described may be implemented as integrated circuit (IC). Further, where considered appropriate, reference numerals may be repeated among the figures to indicate corresponding or analogous elements.

DETAILED DESCRIPTION

FIG. 1 provides a schematic diagram of a transceiver 100 in which methods and circuits described herein may be implemented. In some examples, the architecture shown in FIG. 1 may also be implemented in a portable electronic device (sometimes called a user equipment (UE)) or a base station for use in a wireless network, for example a Fifth Generation (5G) wireless communication network. As shown in FIG. 1, an attenuator 110 is used in a transmitted signal path and another attenuator 111 is used in a received signal path. The front end receiver portion of the transceiver 100 includes an antenna 101, a duplexer 107, a low noise amplifier (LAN) and mixer circuit 108, the attenuator 111, and an upconverter 112. The attenuator 111 is controlled by an attenuation control signal (shown as RX attenuation control in FIG. 1) to vary the attenuation of the attenuator 111. After the upconverter 112, the received signal is further processed by a receiver automatic gain control (AGC) amplifier 109. The receiver AGC amplifier 109 includes an attenuator 113 and an amplifier 114. The output of receiver AGC amplifier 109 is provided to a baseband analog application specific integrated circuit (ASIC) 106 that converts an analog signal to a digital signal. The gain of the receiver AGC amplifier 109 is controlled by a gain control signal (shown as RX gain control in FIG. 1) to vary the gain of the receiver AGC amplifier 109. The RX gain control signal and RX attenuation control signals may each be a control voltage or a digital control word, for example. Although FIG. 1 shows a baseband analog ASIC and the AGCs operating at baseband, it should be understood that the transceiver 100 may in some examples use RF VGAs and AGCs, for RF communications.

The LNA and mixer circuit 108 in the received signal path receives a radio frequency (RF) signal from the antenna 101, via the duplexer 107. The output from the LNA and mixer circuit 108 is supplied to the attenuator 111. The attenuated signal from the attenuator 111 is provided to the upconverter 112, and the output of the upconverter 112 is provided to the receiver AGC amplifier 109 to adjust the power of the signal. The power-adjusted signal 109 from the AGC amplifier 109 is provided to the baseband analog ASIC 106.

With respect to the transmitted signal path, the baseband analog ASIC 106 receives a baseband modulated digital representation of a waveform or a modulated analog representation of a frequency modulation (FM) waveform. The baseband analog ASIC 106 converts the baseband signal's representation to analog intermediate frequency (IF) form at a constant signal level and supplies the analog IF form to a transmitter AGC amplifier 105. The transmitter AGC amplifier 105 includes an attenuator 115 and an amplifier 116. The transmitter AGC amplifier 105 provides power control to the signal and supplies the power-controlled signal to an upconverter 104. The output from the upconverter 104 is provided to the attenuator 110. The attenuated signal is provided to a power amplifier (PA) and driver circuitry 103. The output from the PA and driver circuitry 103 is provided to the duplexer 107. Finally, the duplexed signal outputted from the duplexer 107 is provided to the antenna 101 for transmission. The gain of the transmitter AGC amplifier 105 is controlled by a gain control signal (shown as TX gain control in FIG. 1) to vary the gain of the transmitter AGC amplifier 105. The attenuator 110 is controlled by a control signal (shown as TX attenuation control in FIG. 1) to control the attenuation provided by the attenuator 110. The attenuator 110 in the transmitted signal path may serve to attenuate the signal to a power level which may be expected to have less interference with other signals. The TX gain control signal and TX attenuation control signals may each be a control voltage or a digital control word, for example.

For attenuators implemented in transceivers, an operating problem of such attenuators is resistance mismatching in a circuitry, which may lead to high distortion and/or poor linearity (leading to narrow useful attenuation range) in certain applications.

Figure 3:
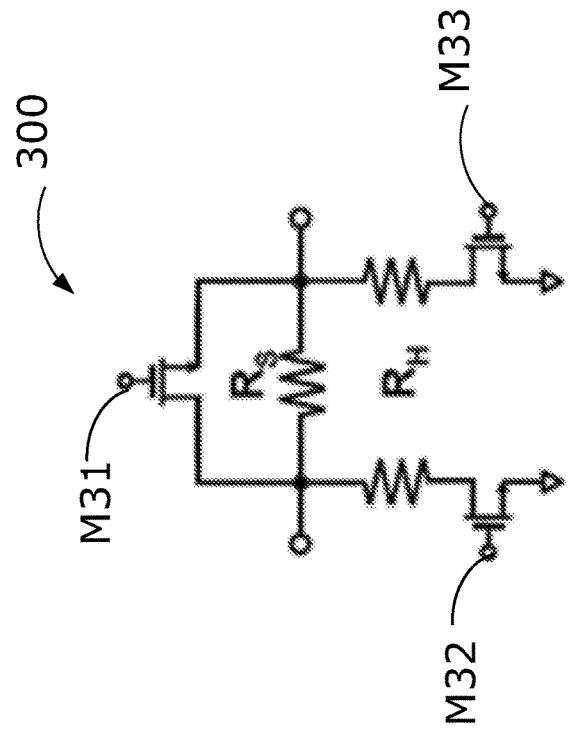
FIG. 3 is a schematic diagram of another variable attenuator in prior art.
Figure 2:
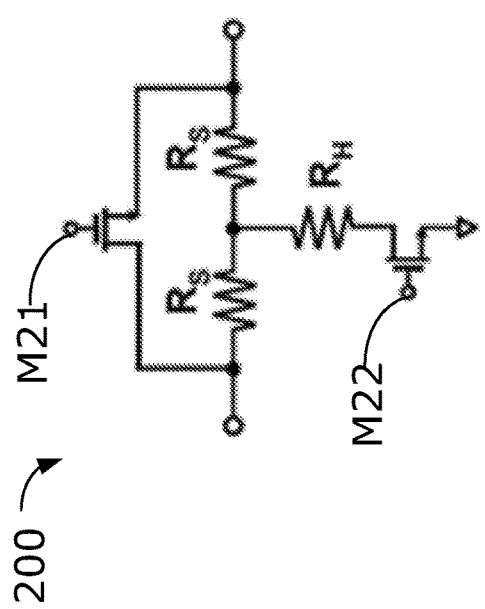
FIG. 2 is a schematic diagram of a variable attenuator in prior art.
Figure 4:
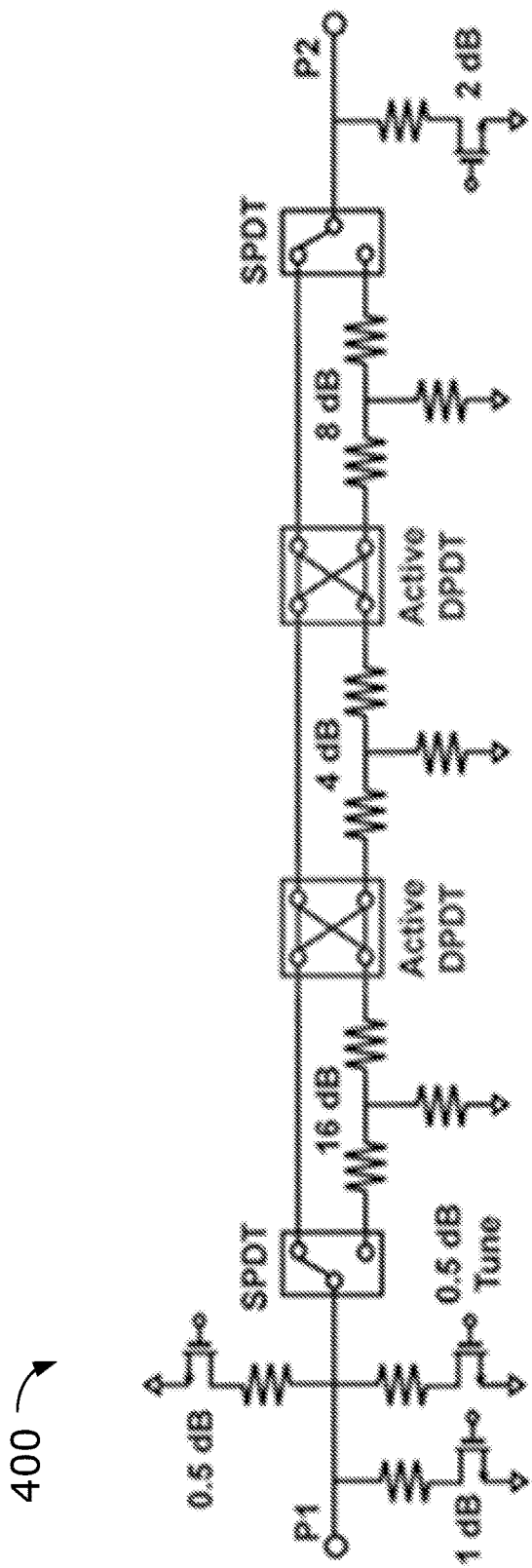
FIG. 4 is a schematic diagram of another variable attenuator in prior art.

To achieve an RF attenuator with a high dynamic attenuation range in an RF communication system, various conventional attenuators have been attempted, as shown in FIG. 2, FIG. 3 and FIG. 4. The conventional attenuator 200 in FIG. 2 has a T-type configuration. The attenuator 200 is controlled by adjusting the operating voltages (gate voltages) on field-effect transistors (FETs) M21 and M22 to control the current paths of the attenuator 200. FIG. 3 shows a conventional attenuator 300 with a Π-type configuration. The attenuator 300 is controlled by adjusting operating voltages (gate voltages) on transistors M31, M32 and M33 to control the current paths of the attenuator 300. The transistors in the attenuator 200 and the attenuator 300 can be controlled digitally to provide fixed attenuation levels. However, the attenuation provided by these attenuators 200, 300 may not be sufficiently variable to attenuate a received or transmitted signal to the desired level and/or resolution. FIG. 4 presents a conventional variable attenuator 400 having several attenuator cells connected with each other via many single-pole-double-throw (SPDT) switches. Each attenuator cell provides a certain attenuation level. The total attenuation level of the variable attenuator 400 can be altered by turning on or off certain attenuator cells, by controlling the SPDT switches. However, again the attenuation provided by the attenuator 400 is at certain fixed attenuation levels, which may not be sufficiently variable. Further, the attenuator 400 requires multiple attenuator cells, which may result in significant increase in loss due to the SPDTs, distortion and/or design complexity.

Figure 5:
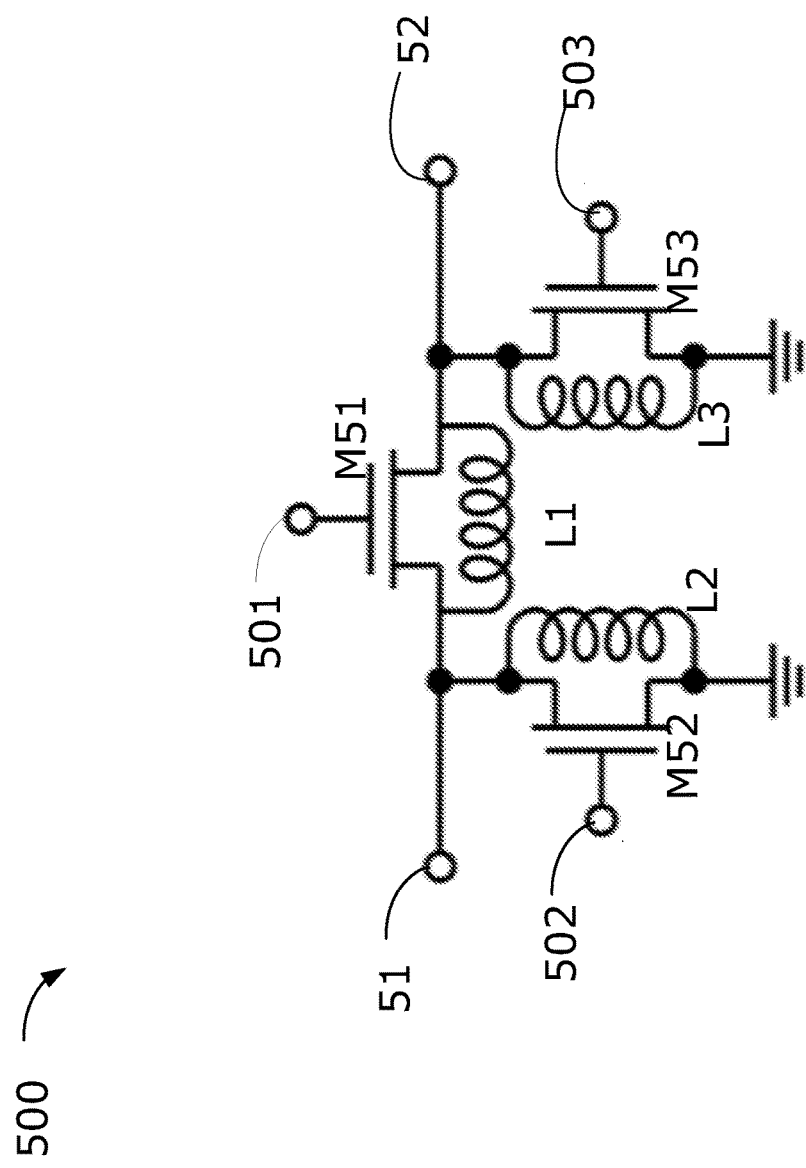
FIG. 5 is a schematic diagram of a transistor-based attenuation circuit having a Π-type configuration.

An attenuation circuit 500 with a Π-type configuration is presented in FIG. 5. A RF signal is received at an input port 51 and the attenuated signal is outputted at an output port 52. The attenuation circuit 500 includes a series impedance unit, in this example a series inductor L1 in parallel with a series transistor M51, and two shunt impedance units, in this example a shunt inductor L2 in parallel with a shunt transistor M52, and a shunt inductor L3 in parallel with a shunt transistor M53. In the example shown, the transistors are all FETs. In other examples, other types of transistors may be used. In an example embodiment, the transistors M51, M52, M53 may be unbiased metal-oxide-semiconductor field-effect transistors (MOSFETs) whose threshold voltage ($V_{TH}$) is close to zero, for example in the range of 200-400 mV. Each of the MOSFETs has a gate (G), a drain (D) and a source (S) terminal. In certain modes of operation, a MOSFET may operate similar to a resistor, with the resistance across the MOSFET being controlled by the gate voltage. In the example shown, a resistance of the transistor M51 may be controlled by a control voltage at a gate 501 of the transistor M51. Similarly, a resistance of the transistor M52 may be controlled by a control voltage at a gate 502 of the transistor M52, and a resistance of the transistor M53 may be controlled by a control voltage at a gate 503 of the transistor M53. Other types of transistors may be similarly controlled to operate as variable resistors, with the resistance being controlled by a control voltage at a terminal of the transistor. The attenuation circuit 500 may thus be used in a variable attenuator to attenuate RF signals with various attenuation levels, by varying resistances of the transistors M51, M52 and M53. The attenuation circuit 500 may provide a suitable variability in attenuation, and be sufficiently small and low power for implementation in portable electronic devices, for example.

Figure 6:
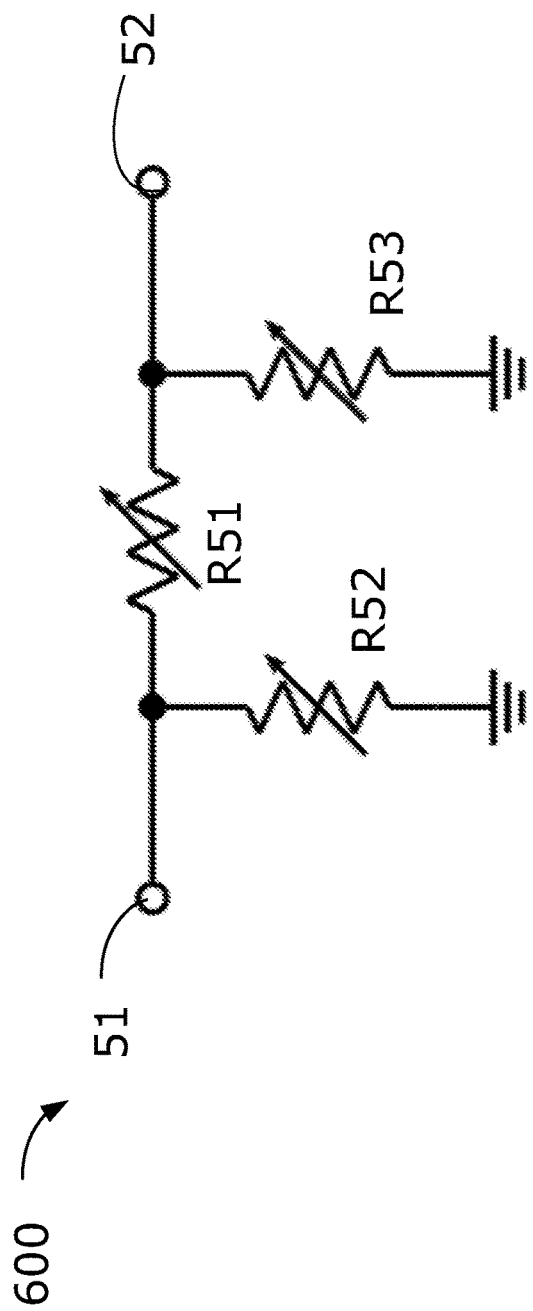
FIG. 6 is a schematic diagram of an equivalent circuit of the attenuation circuit of FIG. 5.

When a RF signal flows through the attenuation circuit 500, the attenuation circuit 500 acts similarly to an equivalent attenuation circuit 600 shown in FIG. 6. The equivalent attenuation circuit 600 has a shunt resistor R52, a shunt resistor R53, and a series resistor R51, each representing the resistance provided by the correspondingly numbered transistors in the attenuation circuit 500. The resistances of the shunt resistors R52, R53 and the series resistors R51 determine the attenuation level of the equivalent attenuation circuit 600 within a variable attenuator.

Referring again to FIG. 5, the resistances of the transistors M51, M52 and M53 can be individually controlled by a control voltage applied at a terminal of each transistor M51, M52, M53. The control voltage should be tightly controlled in order to achieve a high resolution and high precision in the attenuation circuit 500.

Figure 7:
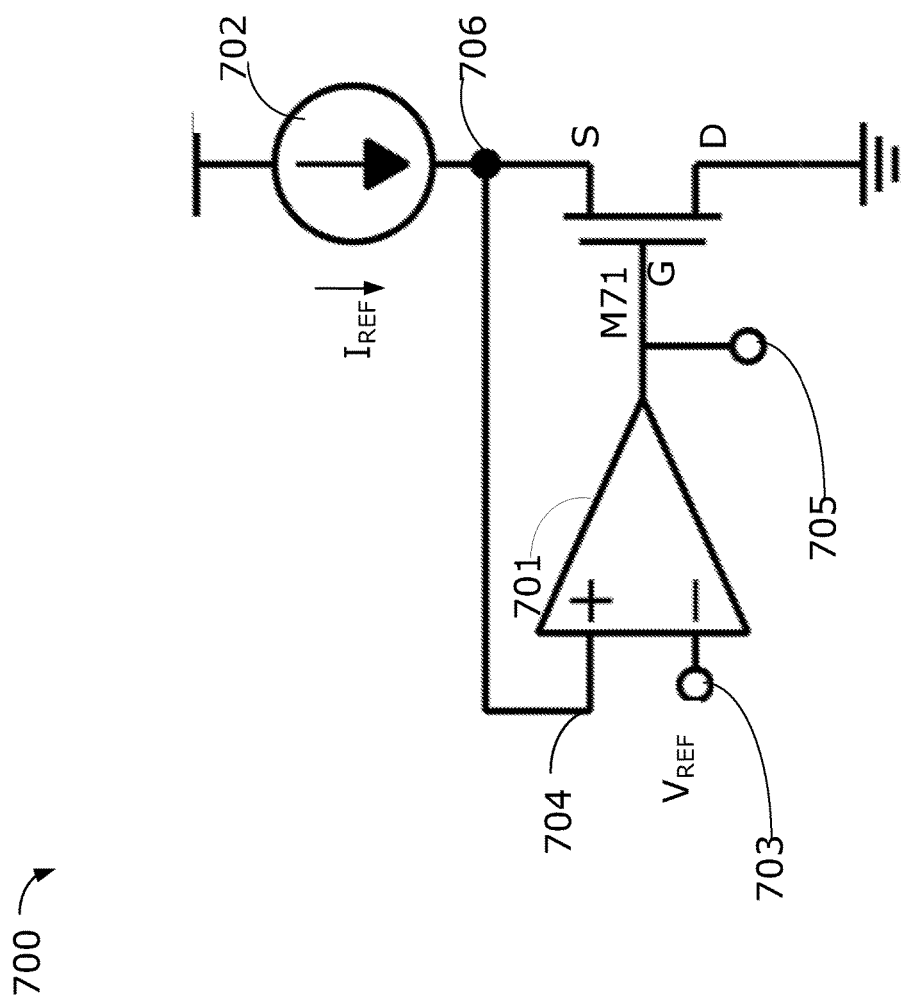
FIG. 7 is a schematic diagram of a prior art control circuit for controlling operation of the transistors in the attenuation circuit of FIG. 5.

The control voltage for each transistor M51, M52, M53 may be provided using a direct current (DC) control circuit. An example control circuit 700 is shown in FIG. 7. The output 705 of the control circuit 700 may be coupled to each transistor M51, M52, M53 to provide the control voltage for varying the resistance of each transistor M51, M52, M53. The DC circuit control 700 includes an amplifier 701, a current source 702 and a transistor M71, in this case a MOSFET. It should be understood that other types of transistors, including other types of FETs or transistors other than FETs, may be used. The current source 702 provides a reference current ($I_{REF}$). A positive input port 704 of the amplifier 701 is coupled to a source of the transistor M61 and an output of the current source 702 at node 706, forming a feedback loop in the DC control circuit 700. A reference voltage ($V_{REF}$) is provided to a negative input port 703 of the amplifier 701. The voltage of the positive input port 704 of the amplifier 701 is same as the voltage of the negative input port 703. Hence, the voltage at node 706, which drops across the transistor M71, is equal to $V_{REF}$. $I_{REF}$ flows across the transistor M71. Thus, the transistor M71 acts as a voltage controlled resistor whose resistance is determined using Equation (1) below:

$$R_{71} = V_{REF}/I_{REF} \qquad \text{Equation (1)}$$

Figure 8:
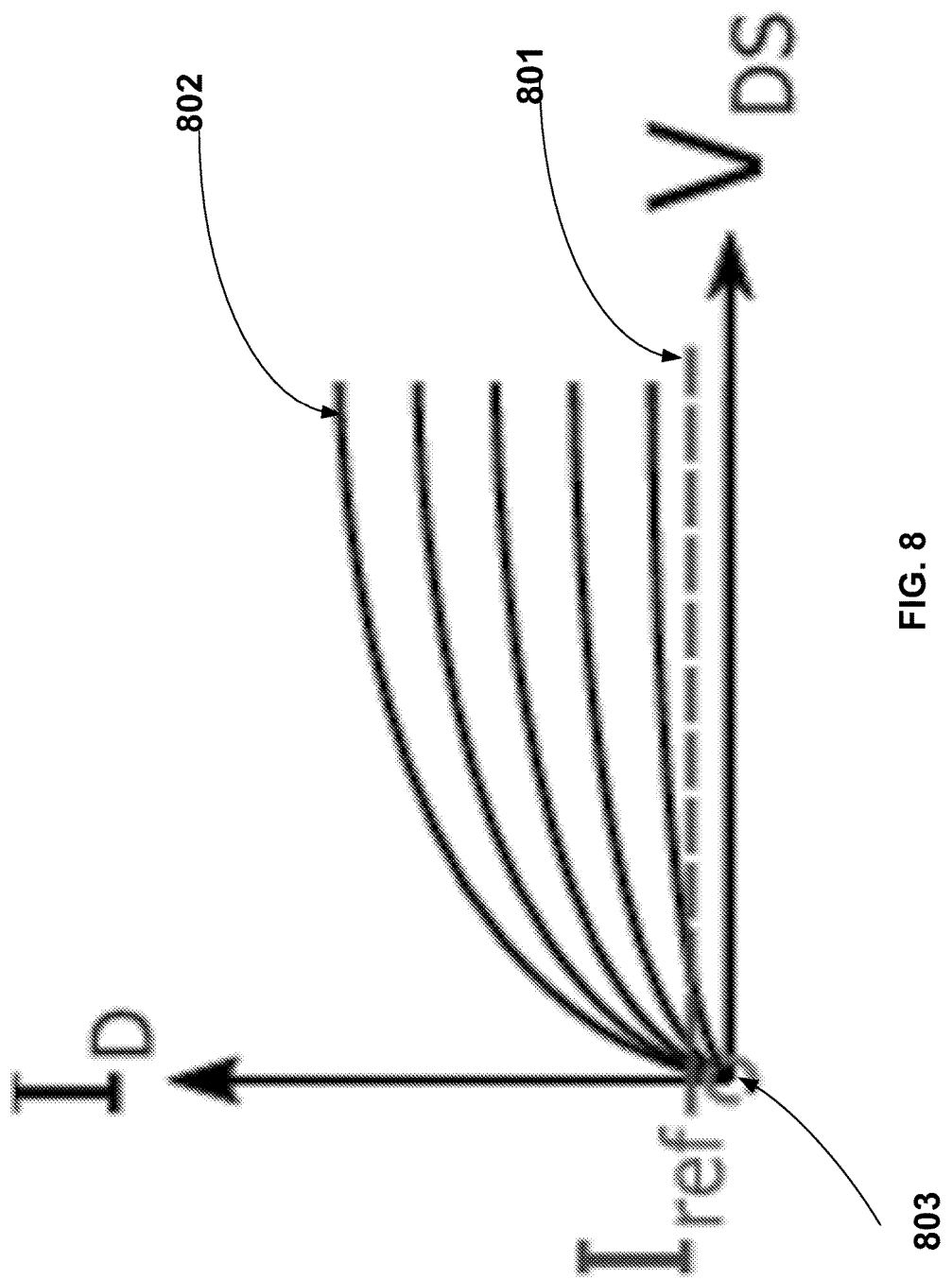
FIG. 8 is characteristic plots of drain current versus voltage between drain and source of a RF transistor in the attenuation circuit of FIG. 5.

FIG. 8 plots the characteristic drain current versus drain to source voltage of the transistor M71 as a dashed line 801. Because the drain current flowing through the transistor M71 is always equal to $I_{REF}$, the resistance of the transistor M71 is proportional to the voltage value at node 706. Accordingly, the resistance of the transistor M71 is varied in accordance with the voltage at node 706, which is equal to $V_{REF}$.

FIG. 8 also shows the characteristics of one of the transistors M51, M52, M53 in the attenuation circuit 500 of FIG. 5. FIG. 8 shows the plots of drain current versus drain to source voltage for several values of $V_{GS}$-$V_{TH}$, where $V_{GS}$ represents voltage from gate to source, and $V_{TH}$ represents threshold voltage of one of the transistors M51, M52, M53. Although $V_{GS}$ is plotted in FIG. 8, other types of transistors (e.g., bipolar transistors) also exhibit similar characteristics. Following the curves plotted in FIG. 8, equivalent resistance of each of the RF transistors M51, M52, M53 is determined by Equation (2) below:

$$R_{RF} = dV_{DS}/dI_D \qquad \text{Equation (2)}$$

where $V_{DS}$ represents voltage dropping across drain and source of a transistor, $I_D$ represents current flowing through the drain of a transistor, and $R_{RF}$ is the resistance of the RF transistor.

By controlling the value of $V_{GS}$-$V_{TH}$ of a given RF transistor M51, M52, M53, the characteristics of that RF transistor are also controlled to follow one of the curves shown in FIG. 8. Consider, for example, series RF transistor M51. One instance of the control circuit 700 may be used to vary the resistance of the transistor M51, by coupling the output 705 of the control circuit 700 to the transistor M51 (e.g., to the gate of the transistor M51 in the case where the transistor M51 is a MOSFET). According to FIG. 8, Equation (1) and Equation (2), for a specific value of $V_{GS}$-$V_{TH}$, the curve 802 and the dashed line 801 only have one intersection point, which is close to where the drain current and the drain to source voltage of both the transistors M51 and M71 are close to the origin 803 (i.e., where the drain current and the drain to source voltage are both close to zero). At this operation point, close to the origin 803, the transistor M51 acts as a resistor in a DC circuit. The other RF transistors M52 and M53 may be similarly controlled by coupling each transistor M52, M53 to a respective instance of the control circuit 700. It should be noted that each transistor M51, M52, M53 in the attenuation circuit 500 may be controlled to operate using a different control voltage (e.g., control circuit 700 may provide control voltages independently of each other), hence $V_{GS}$-$V_{TH}$ may be different for each transistor M51, M52, M53 and each transistor M51, M52, M53 may follow a different curve in FIG. 8.

Matching resistance between the transistor M51, M52, M53 in the attenuation circuit 500 and the control circuit 700 is generally desirable, in order to achieve higher attenuation resolution and to achieve lower relative error between the resistance of the DC transistor (in the control circuit 700) and the resistance of the RF transistor (in the attenuation circuit 500). When there is good matching between the DC transistor and the RF transistor, then the resistance of the RF transistor can be accurately and precisely controlled by controlling the resistance of the DC transistor. Operation of M71 at the intersection point enables resistance matching the control circuit 700 and the transistor M51. However, although it is desirable to operate the transistors M51, M52, M53 of the attenuation circuit 500 close to the origin 803, the voltage drop across the transistor M71 in the control circuit 700 may be significantly greater than zero, causing a resistance mismatch. It is difficult to achieve a voltage drop across the transistor M71 in the control circuit 700 that is small enough to enable the transistor M71 to operate close to the origin point 803. The resulting resistance mismatch between the control circuit 700 and the RF transistor that is being controlled may result in poor control of the attenuation circuit 500.

Figure 9A:
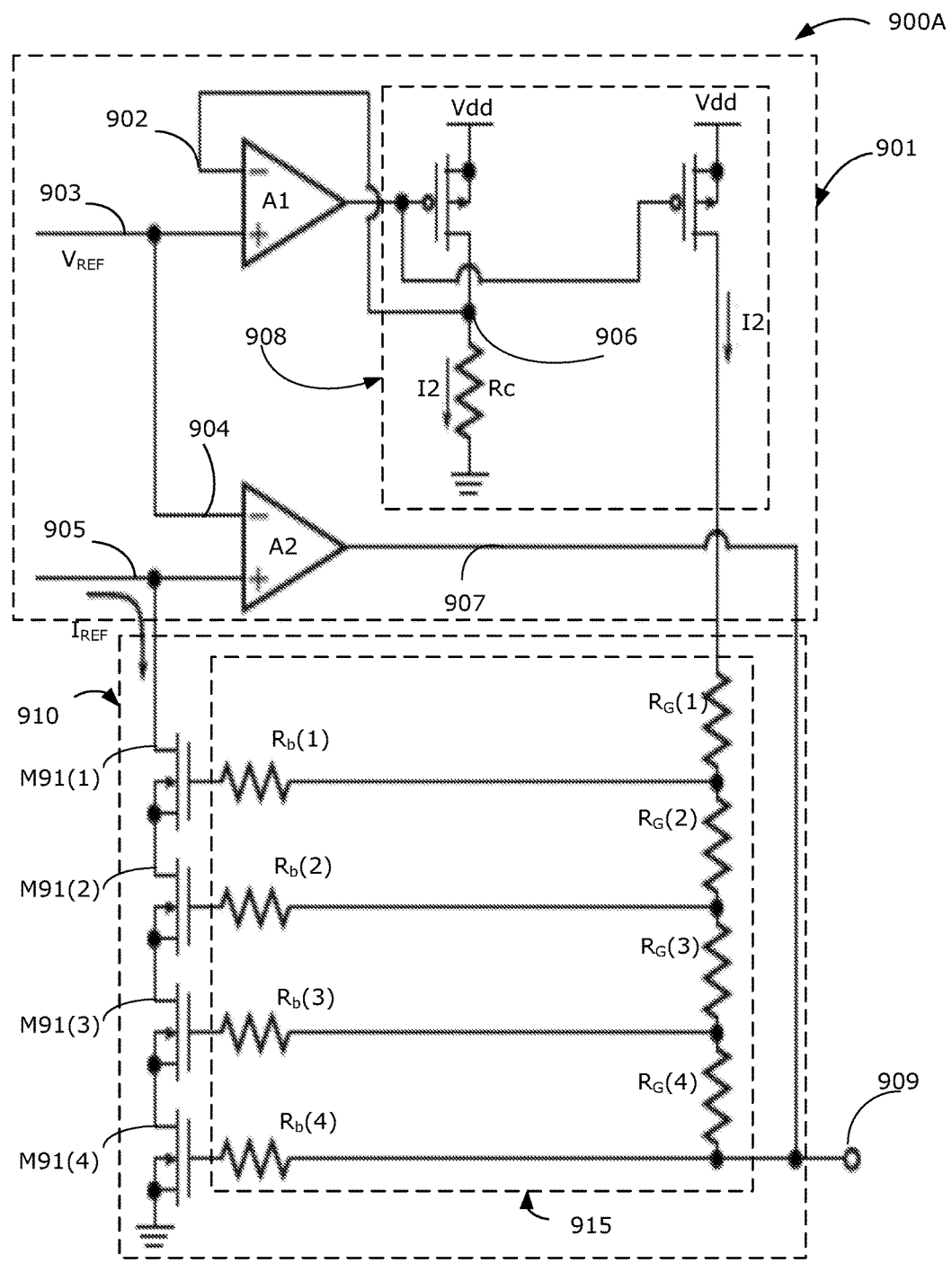
FIG. 9A is a schematic diagram of a control circuit according to example embodiments.

FIG. 9A shows an example DC control circuit 900A that may be used to provide a suitable control voltage for controlling operation of the transistors in the RF attenuation circuit 500A. The control circuit 900A provides better resistance matching than the control circuit 700 of FIG. 7. The example control circuit 900A may be used to control RF transistors in other transistor-based RF circuits requiring fine control, for example in phase shifters and variable gain amplifiers, among others. For the purpose of illustration, the present disclosure will discuss implementation in a variable attenuator, further below, but such discussion is not intended to be limiting.

The control circuit 900A includes a first sub-circuit 901 and a second sub-circuit 910. The first sub-circuit 901 has a first input port 903 to accept the reference voltage ($V_{REF}$), and a second input port 905 to accept the reference current ($I_{REF}$). As previously noted, $V_{REF}$ and $I_{REF}$ are independently adjustable to set the control voltage provided by the control circuit 900A. Generally, it is sufficient for at least one of $V_{REF}$ or $I_{REF}$ to be adjustable. The second sub-circuit 910 includes a plurality of stacked transistors M91(1) to M91(4) (generally referred to as M91) coupled in series with each other. In the example shown, the stacked transistors M91 are N-channel MOSFETs, however, other types of transistors may be used, including, for example, other types of FETS such as P-channel MOSFETs (PMOSFETs) or high-electron mobility transistors (HEMTs), or bipolar transistors such as bipolar junction transistors (BJTs) or heterojunction bipolar transistors (HBTs). In the case of FETs, the stacked transistors M91 are stacked by coupling a source and a drain of each transistor M91 in series. Using FETs for the stacked transistors M91 may be preferred, in order to more accurately achieve similar conditions in each of the transistors M91, as discussed further below.

The stacked transistors M91 are coupled between the first sub-circuit 901 and ground. The second sub-circuit 910 also includes a resistor ladder 915 formed by a plurality of first resistors $R_G(1)$ to $R_G(4)$ (generally referred to as $R_G$) and a plurality of second resistors $R_b(1)$ to $R_b(4)$ (generally referred to as $R_b$). The resistor ladder 915 is coupled between the first sub-circuit 901 and an output port 909 of the control circuit 900A. Each rung of the resistor ladder 915 is coupled to control the operating voltage (the gate voltage, in the case of FETs) of a respective one of the stacked transistors M91, as discussed further below. FIG. 9A shows four stacked transistors M91 and a resistor ladder 915 having four rungs, for the purpose of illustration only. Greater or fewer number of transistors M91 (and correspondingly greater or fewer number of rungs in the resistor ladder 915) may be used. For example, there may be 10 stacked transistors M91 coupled in parallel to a resistor ladder 915 having 10 rungs.

As previously mentioned, each stacked transistor M91 is coupled to a respective rung of the resistor ladder 915. In the example where the stacked transistors M91 are FETs, the gate of each transistor M91 is coupled to one end of a respective first resistor $R_G$, via a respective second resistor $R_b$. The resistances of each first resistor $R_G$ may be substantially equal. The resistances of the second resistors $R_b$ may be substantially equal. The second resistors $R_b$ may be included in the control circuit 900A to better match resistors present in the RF circuit being controlled. In some examples, $R_b$ may be omitted. In some examples, other resistors may be connected to the terminals of the stacked transistors M91, for example in order to match other resistors present in the RF circuit. The coupling of the stacked transistors M91 to the resistor ladder 915 may help to ensure that the total voltage drop is evenly divided among the stacked transistors M91. The result is that that the voltage conditions experienced by each of the stacked transistors M91 are substantially the same, as discussed further below.

The output port 909 is coupled to a last transistor M91(4) of the stacked transistors M91. The last transistor M91(4) is also coupled to ground. The control voltage provided at the output port 909 is thus set by a voltage drop (voltage between gate and source, in the case where the transistors M91 are MOSFETS) of the transistor M91(4).

The first sub-circuit 901 serves to set the current flowing through the stacked transistors M91 and the total voltage drop across the stacked transistors M91. The first sub-circuit 901 also serves to set the total voltage drop across the resistor ladder 915 (i.e., the total voltage drop across the series of first resistors $R_G$). Specifically, the first sub-circuit 901 is coupled to the stacked transistors M91 such that the current provided to flow through the stacked transistors M91 is $I_{REF}$ and such that the voltage drop across the stacked transistors M91 is $V_{REF}$. The first sub-circuit 901 is also coupled to the resistor ladder 915 such that the voltage drop across the resistor ladder 915 is set to $V_{REF}$.

In some examples, the first sub-circuit 901 includes one or more feedback loops to ensure that $V_{REF}$ and $I_{REF}$ received at the input ports 903, 905 are correctly provided to the second sub-circuit 910. In the example shown, the first circuit 901 includes a first operational amplifier (op amp) A1 and a second op amp A2. The first op amp A1 has a negative input port 902 and a positive input port connected to the input port 903. The first op amp A1 is coupled to a current mirror 908. Although an example configuration of the current mirror 908 is illustrated, other ways of implementing the current mirror 908 may be used. The second op amp A2 has a negative input port 904, a positive input port connected to the input port 905 and an output port 907 that is connected to the output port 909 of the control circuit 900A.

For both of the op amps A1 and A2, the voltage at the negative input port 902, 904 is equal to the voltage at the positive input port 903, 905. Output from the op amp A1 is coupled back to the negative input port 902 of the op amp A1, via the current mirror 908, thus forming a feedback loop. Output from the op amp A2 is coupled back to the positive input port 905 of the op amp A2, via the second sub-circuit 910, thus forming another feedback loop. The negative input port 904 of the op amp A2 is also connected to the input port 903. Thus, all input ports 902, 903, 904 and 905 of the op amps A1 and A2 are set at $V_{REF}$. In the illustrated example embodiment, the negative input port 902 is coupled to the node 906 of the current mirror 908. Hence, the voltage at the node 906 is also set to $V_{REF}$.

In the example shown, the node 906 of the current mirror 908 is coupled to ground via a third resistor Rc. A current I2 flowing through Rc is set by the following Equation (3):

$$I2 = V_{906}/Rc \qquad \text{Equation (3)}$$

where $V_{906}$ represents voltage between the node 906 to ground (as noted above, $V_{906}$ is equal to $V_{REF}$). Rc is selected to equal to the sum resistance of the plurality of first resistors $R_G$ in the resistor ladder 915. For example, if the number of the first resistors $R_G$ is N and the resistances of the first resistors $R_G$ are substantially equal, Rc is equal to $R_G$ times N.

The output of the current mirror 908 is coupled to the output port 909 of the control circuit 900A via the plurality of first resistors $R_G$ in another feedback loop, such that a current equal to I2 flows through the plurality of first resistors $R_G$.

Thus, the voltage drop across the plurality of first resistors $R_G$ is determined by the following Equation (4):

$$V_{RG} = I2 \times N \times R_G \qquad \text{Equation (4)}$$

where $V_{RG}$ represents the total voltage drop across the plurality of first resistors $R_G$.

In accordance with Equation (3) and Equation (4), Rc is equal to $R_G$ times N. Thus, the voltage drop across the first resistors $R_G$ is equal to the voltage at the node 906 to ground, which is equal to $V_{REF}$. Accordingly, the first sub-circuit 901 sets the voltage drop across the plurality of first resistors $R_G$ to be equal to $V_{REF}$. When the plurality of first resistors $R_G$ all have substantially the same resistance, the voltage dropping across the plurality of first resistors $R_G$ is divided equally such that the voltage dropping across each first resistor $R_G$ is equal to $V_{REF}/N$.

As mentioned previously, the stacked transistors M91 are coupled to the rungs of the resistor ladder 915, such that the voltage drop across each transistor M91 is equal to the voltage drop across each first resistor $R_G$. Accordingly, the voltage drop across each transistor M91 is equal to $V_{REF}/N$. In the case of FETs, the voltage drop across each transistor M91 is the voltage between the drain and source of each transistor M91, and can be represented by the following Equation (5):

$$V_{DS1} = V_{DS2} = V_{DS3} = V_{DS4} = V_{REF}/N \qquad \text{Equation (5)}$$

Such a configuration causes each stacked transistor to operate with similar control conditions. For a transistor, the control conditions are determined by the voltages between its terminals. In the case where the stacked transistors M91 are MOSFETs, similar control conditions means that the voltages between gate and source are substantially equal among the transistors M91, voltages between drain and source are substantially equal among the transistors M91, and voltages between bulk and source of each MOSFET are substantially equal among the transistors M91. It should also be noted that the drain current $I_D$ across each transistor M91 is equal to $I_{REF}$. The similarity of the control conditions among the transistors M91 may be further improved by using triple-well transistors. In some examples, where the stacked transistors M91 are FETs other than MOSFETs (e.g., HEMTs), similar control conditions means that the transistors M91 have voltages between drain and source that are substantially equal among the transistors M91, and voltages between gate and source that are substantially equal among the transistors M91. In some examples, where the stacked transistors M91 are bipolar transistors (e.g., BJTs or HBTs), similar control conditions means that the transistors M91 have voltages between collector and emitter that are substantially equal among the transistors M91, and voltages between base and emitter that are substantially equal among the transistors M91.

When operating with similar control conditions, each stacked transistor M91 has substantially equal resistance because $V_{DS}$ and $I_D$ (in the case where the transistors are MOSFETs) of each stacked transistor are substantially equal. In some examples, the stacked transistors may be triple-well or isolated transistors, such that the threshold voltages of the stacked transistor M91 are substantially the same. Further, the channel length and the channel width of the stacked transistors M91 may all be substantially equal.

Figure 9B:
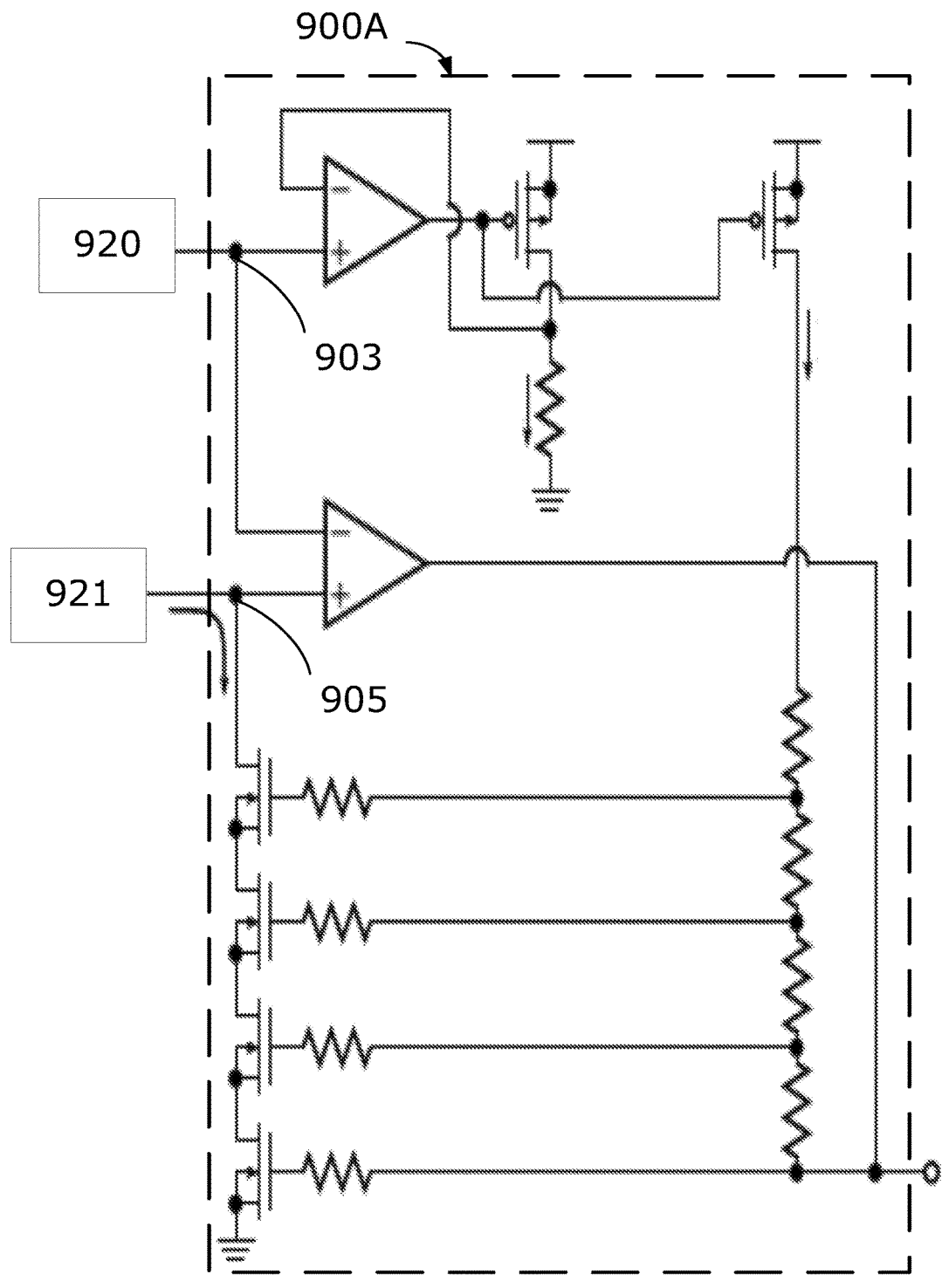
FIG. 9B is a schematic diagram of the control circuit in FIG. 9A coupled to a voltage output digital to analog converter (DAC) and a current output DAC according to example embodiments.

FIG. 9B illustrates an example implementation in which an adjustable voltage source 920 (e.g., a voltage output digital to analog converter (DAC), such as a 6-bit voltage DAC) is used to provide $V_{REF}$ to the control circuit 900A and an adjustable current source 921 (e.g., current output DAC, such as a 3-bit current DAC) is used to provide $I_{REF}$ to the control circuit 900A. In some examples, only one of the voltage source 920 or the current source 921 is adjustable. The voltage source 920 is coupled to the voltage input port 903 and the current source 921 is coupled to the current input port 905.

The voltage source 920 and current source 921 are adjustable (e.g., by a signal from a processing system, described further below) to provide a sufficiently small $I_{REF}$ and $V_{REF}$ to reduce or minimize the resistance mismatch between the control circuit 900A and the RF transistor being controlled. For example, a sufficiently small $I_{REF}$ may be in the range of about 1-100 μA, and a sufficiently small $V_{REF}$ may be in the range of about 1-64 mV. Generally, for resistance matching, it is desirable to set $I_{REF}$ and $V_{REF}$ such that current and voltage conditions at each transistor M91 of the control circuit 900A match current and voltage conditions of the RF transistor being controlled. In particular, as illustrated in FIG. 8, the desired current and voltage conditions are close to zero. In the case of FET transistors, it is desirable for $I_D$ and $V_{DS}$ of each transistor M91 in the control circuit 900A to match $I_D$ and $V_{DS}$ of the RF transistor. Using a multiple-bit voltage DAC as the voltage source 920 and a multiple-bit current DAC as the current source 921 helps to provide better voltage and current resolution, as the number of bits in the DACs increases. The adjustability of the voltage source 920 enables control of the output voltage at the output port 909, and the adjustability of the current source 921 enables matching of the DC transistors M91 and the RF transistor being controlled, for controlling resistance of the RF transistor. Generally, regardless of the transistor type, it is desirable for current and voltage conditions of each DC transistor in the control circuit to match the current and voltage conditions of the RF transistor, to achieve resistance matching. As explained above, $I_D$ of each transistor M91 is equal to $I_{REF}$ and $V_{DS}$ is equal to $V_{REF}/N$. Because $V_{REF}$ is divided by the number N of transistors M91, $V_{DS}$ of the transistors M91 can be finely controlled to be very small and with a fine degree of control. It has been found that selecting N=10 provides the desirable amount of control, without requiring an overly large control circuit. Other numbers of transistors M91 may also be used. Thus, the transistors M91 in the control circuit 900A may be controlled, by adjusting $I_{REF}$ and $V_{REF}$, to operate under conditions similar to the RF transistor being controlled and resistance mismatch may be avoided or reduced.

FIG. 9C illustrates an example variable attenuator 900C in which the attenuation circuit 500A of FIG. 5A is controlled using a plurality of the control circuits 900A of FIG. 9A. In this example, the transistor-based RF circuit is an attenuation circuit with a Π-type configuration, although other configurations are possible, such as a T-type configuration or other RF circuits with one or more transistors.

In the example shown in FIG. 9C, the variable attenuator 900C includes three control circuits 900A(1) to 900A(3) (generally referred to as control circuits 900A). In some cases, fewer control circuits 900A may be used, for example a single control circuit 900A may be used to control both shunt transistors M52, M53 so that the two shunt resistances are equal. Each control circuit 900A has a respective output port 909(1) to 909(3) (generally referred to as output ports 909). The output port 909 of a given control circuit 900A provides a control signal for controlling at least one of the transistors M51, M52, M53 of the attenuation circuit 500A. In the example shown, each transistor M51, M52, M53 is coupled to a respective output port 909 of a respective control circuit 900A. In other examples, two or more RF transistors may be coupled to the output port 909 of a given control circuit 900A. In the case where the transistors M51, M52, M53 are FETs, the control circuits 900A are coupled at the gate terminal as shown in FIG. 9C. The control circuit 900A provides a control voltage to the respective RF transistor M51, M52, M53 to control the variable resistance of the transistor M51, M52, M53 of the attenuation circuit 500A. Using the control circuit 900A, the transistor M51, M52, M53 may be controlled with little or no resistance mismatch. The result is that the variable attenuator 900C may have a more accurate resolution, compared to when the control circuit 700 of FIG. 7 is used. In the variable attenuator 900C, $V_{REF}$ and $I_{REF}$ of each control circuit 900A may be independently controlled (e.g., using an independent voltage source 920 and an independent current source 921 for each control circuit 900A).

Figure 9D:
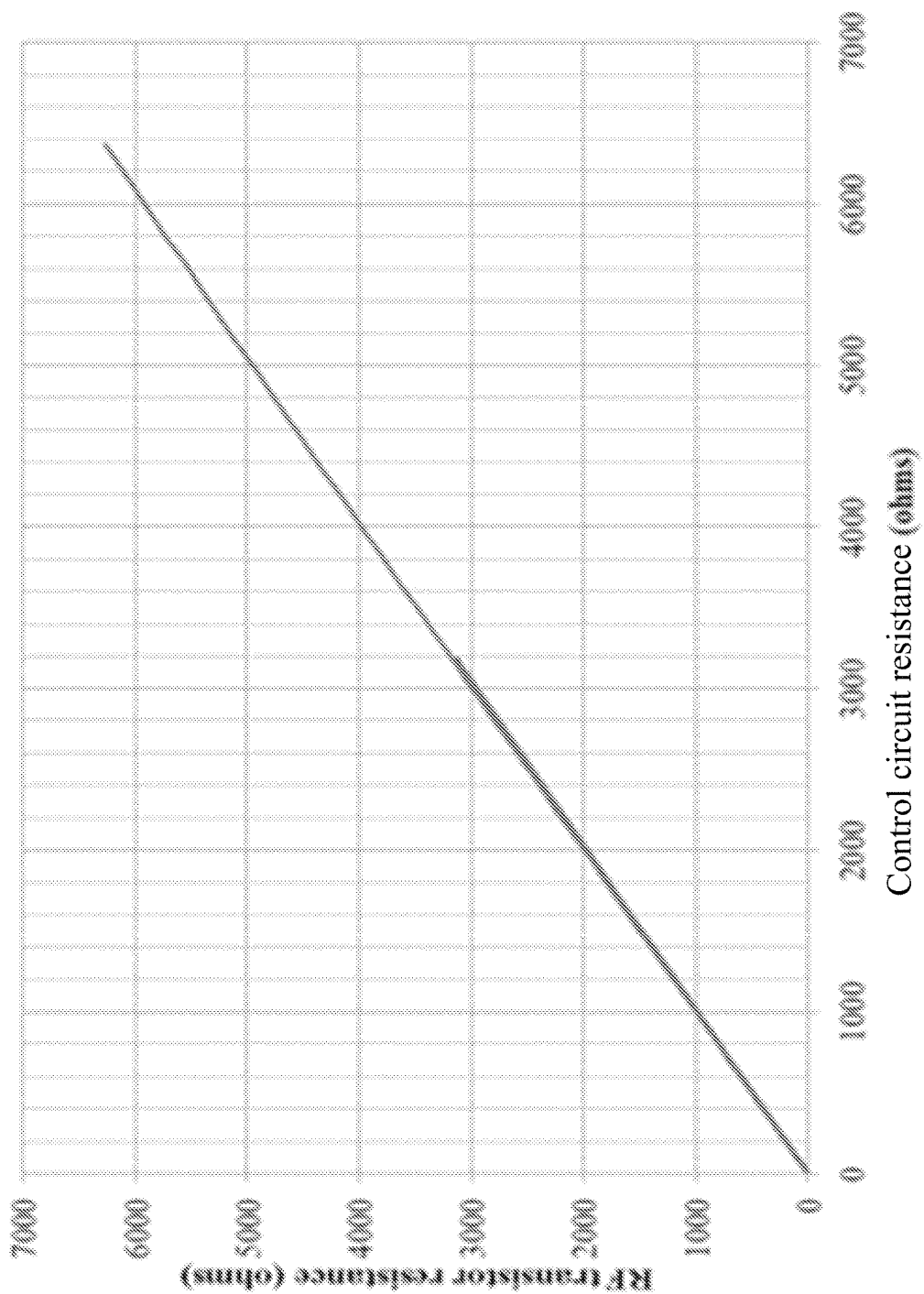
FIG. 9D is a plot of the resistance of an RF transistor in the attenuation circuit versus resistance in the control circuit of FIG. 9A, according to example embodiments.

FIG. 9D is a plot of the resistance of one RF transistor in the attenuation circuit 500A vs. the resistance of one control circuit 900A used to control the RF transistor. The results are illustrated for operation at 73.5 GHz. As shown in FIG. 9D, there is good agreement between the resistance of the control circuit 900A and the resistance of the RF transistor. This demonstrates good resistance matching between the example disclosed control circuit 900A and the RF transistor being controlled.

Figure 9E:
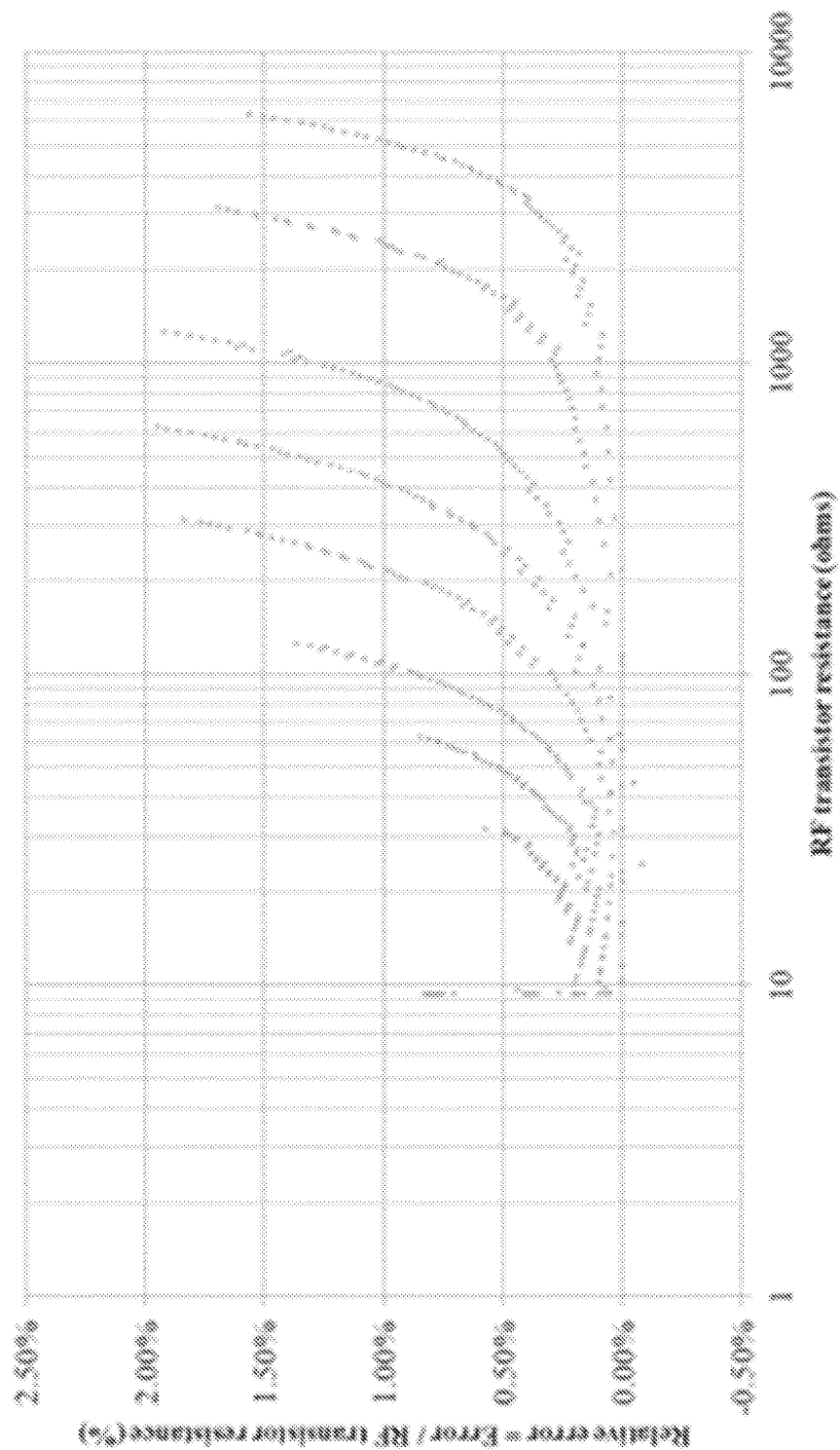
FIG. 9E is a plot of relative error versus resistance of an RF transistor in the attenuation circuit, when controlled using the control circuit of FIG. 9A, according to example embodiments.

FIG. 9E is a plot of relative error versus a resistance of a RF transistor when the RF transistor is controlled using the example disclosed control circuit 900A. The relative error is equal to the difference between the resistance of the control circuit 900A and the resistance of the RF transistor, divided by resistance of the RF transistor. As illustrated in FIG. 9E, a relative error of 2% or less may be achieved. Each curve in the plot corresponds to a particular value of $I_{REF}$ set at the control circuit 900A. Once $I_{REF}$ is set, $V_{REF}$ can be varied to achieve different resistance values. As can be seen in FIG. 9E, for a given desired RF transistor resistance, there may be more than one $I_{REF}$ setting that can be used for the control circuit 900A. A suitable $I_{REF}$ value may be selected so as to reduce the relative error, for a given desired resistance.

Figure 9F:
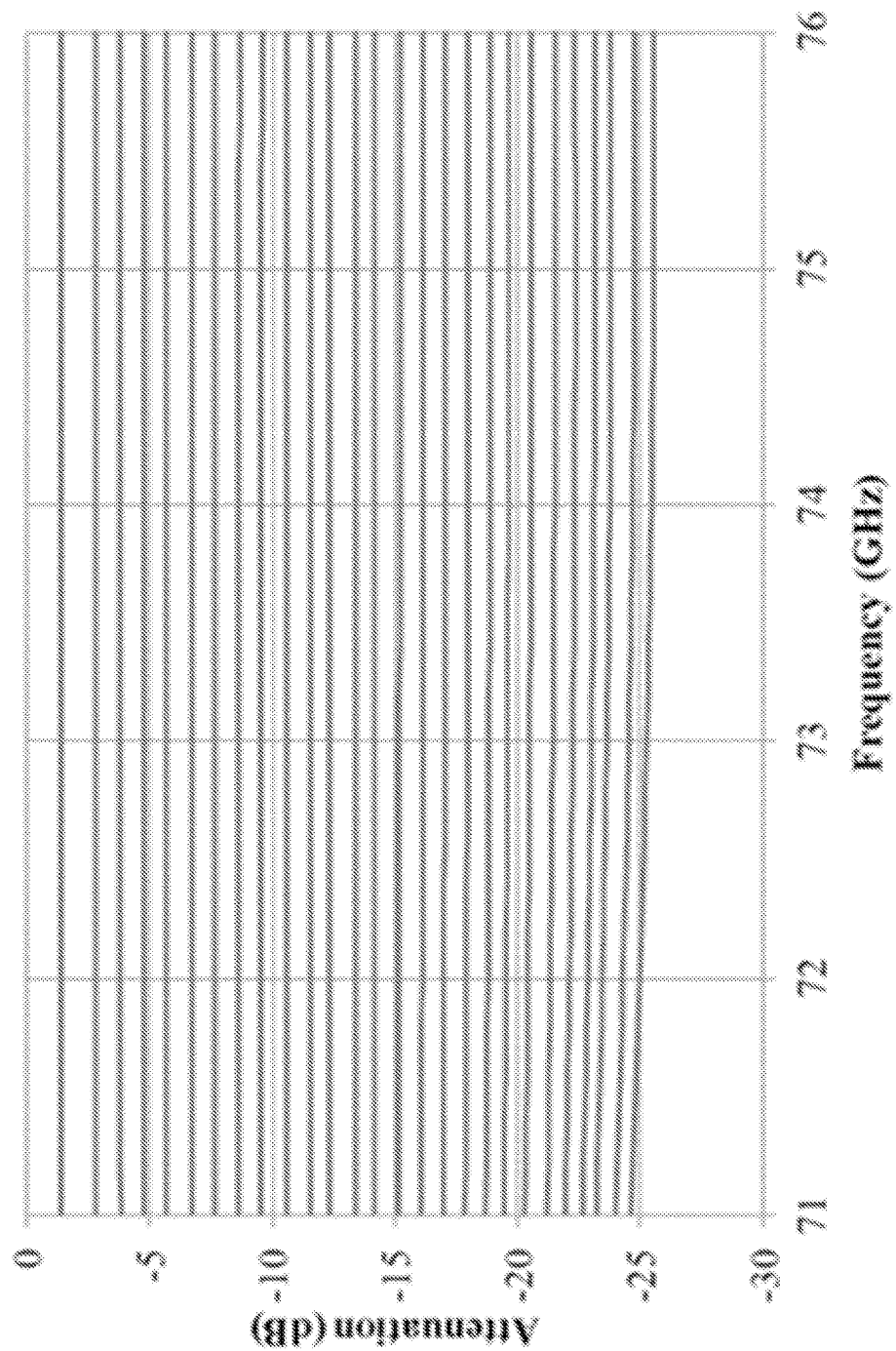
FIG. 9F is a plot of attenuation level versus frequency in the variable attenuator of FIG. 9C, according to example embodiments.

FIG. 9F is a simulation graph that plots variable attenuation level of an attenuator (in this example, a simulation of the attenuator 900C shown in FIG. 9C), versus frequency. The simulation results demonstrate that the attenuator 900C, using the example disclosed control circuit 900A, exhibits sufficiently accurate and precise resolution. For smaller attenuations, attenuation level of the attenuator 900C was found to have only about 0.05 dB variation over a Monte Carlo simulation.

Figure 10:
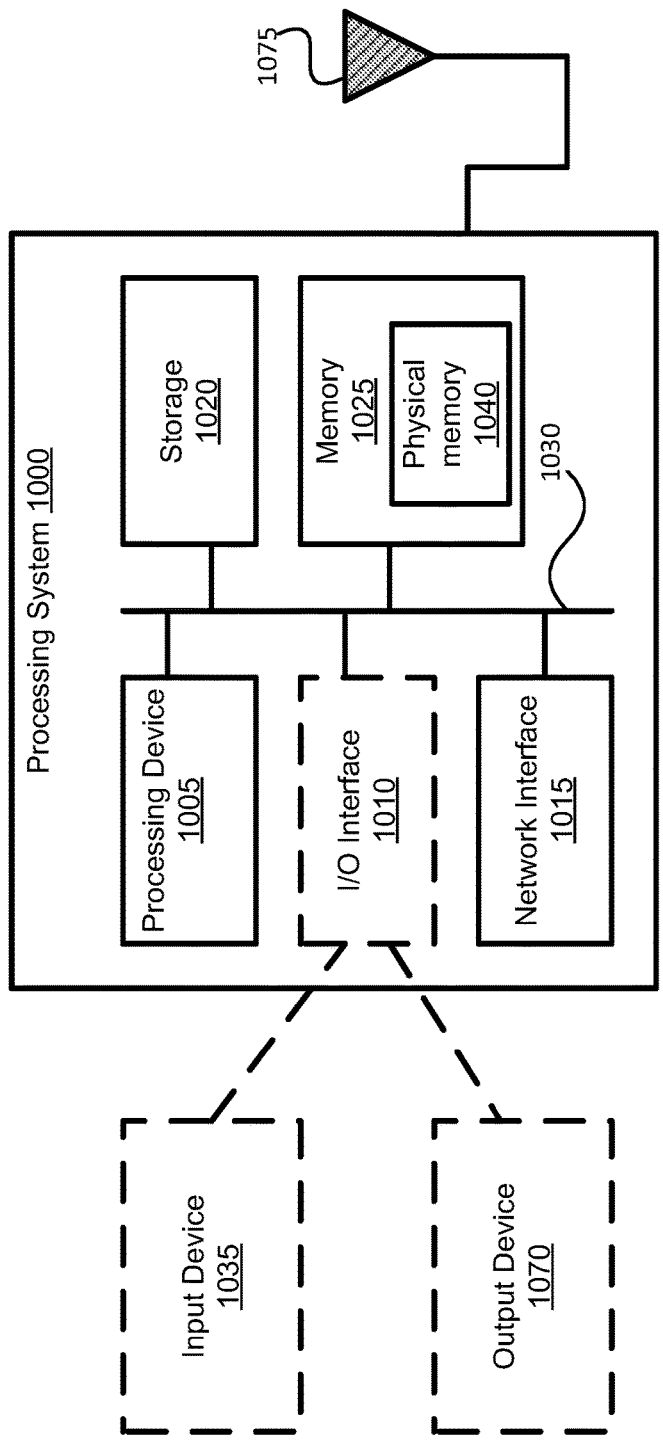
FIG. 10 is a schematic representation of an example processing system in which the control circuit of FIG. 9A and/or the variable attenuator of FIG. 9C may be implemented.

FIG. 10 is a schematic diagram of an example processing system 1000, in which examples of the disclosed control circuit and/or attenuator may be implemented. For example, the processing system 1000 may be used for a portable electronic device or a base station implemented in 5G communication network, and may include a control circuit for controlling a RF circuit, such as a variable attenuation circuit, phase shifter circuit, variable amplifier circuit or other RF circuit. The processing system 1000 may also be used to control operation of the control circuit itself, for example by adjusting $I_{REF}$ and $V_{REF}$. Other processing systems suitable for implementing examples described in the present disclosure may be used, which may include components different from those discussed below. Although FIG. 10 shows a single instance of each component, there may be multiple instances of each component in the processing system 1000 and the processing system 1000 could be implemented using parallel and/or distributed systems.

The processing system 1000 may include one or more processing devices 505, such as a processor, a microprocessor, an application-specific integrated circuit (ASIC), a field-programmable gate array (FPGA), a dedicated logic circuitry, or combinations thereof. The processing system 1000 may also include one or more optional input/output (I/O) interfaces 1010, which may enable interfacing with one or more optional input devices 1035 and/or output devices 1070. The processing system 1000 may include one or more network interfaces 1015 for wired or wireless communication with a network (e.g., an intranet, the Internet, a P2P network, a WAN and/or a LAN, and/or a Radio Access Network (RAN)) or other node. The network interfaces 1015 may include one or more interfaces to wired network and wireless network. Wired network may make use of wired links (e.g., Ethernet cable). Wireless network, where they are used, may make use of wireless connections transmitted over an antenna such as antenna 1075. The network interfaces 1015 may provide wireless communication via one or more transmitters or transmit antennas and one or more receivers or receive antennas, for example. In this example, a single antenna 1075 is shown, which may serve as both transmitter and receiver. However, in other examples there may be separate antennas for transmitting and receiving. The processing system 1000 may also include one or more storage units 1020, which may include a mass storage unit such as a solid state drive, a hard disk drive, a magnetic disk drive and/or an optical disk drive.

The processing system 1000 may include one or more memories 1025 that can include physical memory 1040, which may include a volatile or non-volatile memory (e.g., a flash memory, a random access memory (RAM), and/or a read-only memory (ROM)). The non-transitory memories 1025 (as well as storage 1020) may store instructions for execution by the processing devices 1005, such as to carry out methods such as those described in the present disclosure. The memories 1025 may include other software instructions, such as for implementing an operating system (OS), and other applications/functions. In some examples, one or more data sets and/or modules may be provided by an external memory (e.g., an external drive in wired or wireless communication with the processing system 1000) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 1030 providing communication among components of the processing system 1000. The bus 1030 may be any suitable bus architecture including, for example, a memory bus, a peripheral bus or a video bus. Optional input devices 1035 (e.g., a keyboard, a mouse, a microphone, a touchscreen, and/or a keypad) and optional output devices 1070 (e.g., a display, a speaker and/or a printer) are shown as external to the processing system 1000, and connected to optional I/O interface 1010. In other examples, one or more of the input devices 035 and/or the output devices 1070 may be included as a component of the processing system 1000.

In the present disclosure, an example DC control circuit is described for controlling a transistor in a RF circuit. Using the examples disclosed herein, the control circuit may help to provide more accurate control of a RF circuit, with improved resistance matching. When used to control transistors of a RF attenuation circuit, a high resolution and improved linearity may be achieved. The disclosed circuits may be used in 5G portable devices (e.g., mobile handsets) and base stations to boost performance with little or no battery usage penalty.

The disclosed control circuit may be implemented at least in part using digital circuitry, which may help to reduce loss at minimum attenuation, compared to a conventional control circuit, at little added cost. The disclosed control circuit also may exhibit relatively low phase variation, which is generally desirable for various applications (e.g., phase shifters and variable gain amplifiers).

The disclosed attenuator, using the disclosed control circuit, has a symmetric configuration, and hence may be used before or after an amplifier. Further, a relatively wide attenuation and accurate step size range may be achieved, due to digital control of $I_{REF}$ and $V_{REF}$ of the control circuit. The control circuit may be programmable in-place (e.g., after the control circuit is fabricated in an integrated circuit (IC)).

The attenuator circuit disclosed herein may achieve sufficiently high linearity and good power handing at substantially all attenuation level of interest when used in 5G portable devices and base stations. In particular, such performance may be achieved when handling a large signal that requires low attenuation. Moreover, the disclosed control circuit, which includes feedback loops, may be relatively insensitive to process, voltage and temperature (PVT) variation, and may thus be used to control the resistance of the RF transistor coupled accurately, under different conditions.

For clarity, the present disclosure has described examples in which the control circuit is implemented using NMOSFETs. In some examples, implementation with PMOSFETs may be possible. In some examples, implementation may use other circuits including other types of FETs such as metal-semiconductor field-effect transistors (MESFETs) or HEMTs, or bipolar transistors such as HBTs or BJTs, and other types of transistors. As used herein, "transistor" generically refers to any active circuit, and is not limited to a FET.

Certain adaptations and modifications of the described embodiments can be made. Therefore, the above discussed embodiments are considered to be illustrative and not restrictive. Although this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A control circuit for controlling operation of a radio frequency (RF) transistor in a transistor-based circuit, the control circuit comprising:
 a first sub-circuit including:
  a first input port to accept a reference voltage; and
  a second input port to accept a reference current;
  at least one of the reference voltage or the reference current being adjustable; and
 a second sub-circuit including:
  a plurality of stacked transistors coupled between the first sub-circuit and ground; and
  a resistor ladder coupled between the first sub-circuit and an output port of the control circuit;
 the first sub-circuit being coupled to the plurality of stacked transistors to provide the reference current to flow through the plurality of stacked transistors and to set a total voltage drop across the plurality of stacked transistors equal to the reference voltage;
 the first sub-circuit being coupled to the resistor ladder to set a total voltage drop across the resistor ladder equal to the reference voltage;
 each rung of the resistor ladder being coupled to control an operating voltage of a respective one of the plurality of stacked transistors, to cause each stacked transistor to operate with similar control conditions;
 the output port of the control circuit being coupled to one of the plurality of stacked transistors to provide a control voltage set by one of the plurality of stacked transistors.

2. The control circuit of claim 1, wherein the first sub-circuit comprises:
 a current mirror;
 a first operational amplifier (op amp) having a positive input port coupled to the first input port, and an output port coupled to a negative input port of the first op amp in a first feedback loop via the current mirror; and
 a second op amp having a positive input port coupled to the second input port, a negative input port coupled to the first input port, and an output port coupled to the output port of the control circuit, the output port of the second op amp also being coupled to the positive input port of the second op amp in a second feedback loop via the second sub-circuit;
 wherein the stacked transistors are coupled between the positive input port of the second op amp and ground; and
 wherein the resistor ladder is coupled between an output of the current mirror and the output port of the control circuit.

3. The control circuit of claim 1, wherein the stacked transistors are triple-well or isolated transistors.

4. The control circuit of claim 1, wherein the plurality of stacked transistors are field-effect transistors (FETs), and wherein the similar control conditions comprise: voltages between a gate and a source of each stacked transistor are substantially equal, and voltages between a drain and the source of each stacked transistor are substantially equal.

5. The control circuit of claim 4, wherein the plurality of stacked transistors are metal-oxide-semiconductor FETs (MOSFETs), and wherein the similar control conditions further comprise: voltages between a bulk and the source of each stacked transistor are substantially equal.

6. The control circuit of claim 4, wherein at least one of the reference voltage or the reference current is adjustable to enable the voltage between the drain and the source of each stacked transistor to be close to zero, and current flow across each stacked transistor to be close to zero.

7. The control circuit of claim 4, wherein each rung of the resistor ladder is connected to a gate of a respective stacked transistor, and the output port of the control circuit is provided at a gate of an end stacked transistor in the plurality of stacked transistors, wherein the source of the end stacked transistor is coupled to ground.

8. The control circuit of claim 1, wherein the plurality of stacked transistors are bipolar transistors, and wherein the similar control conditions comprise: voltages between a collector and an emitter of each transistor are substantially equal, and voltages between a base and the emitter of each transistor are substantially equal.

9. The control circuit of claim 1, wherein at least one of the reference current or reference voltage is adjustable to enable the current flow across each stacked transistor to match current flow across the RF transistor and the voltage drop across each stacked transistor to match voltage drop across the RF transistor, to achieve resistance matching with the RF transistor.

10. The control circuit of claim 1, wherein the number of stacked transistors is 10.

11. A variable attenuator comprising:
 an attenuation circuit including at least one radio frequency (RF) transistor, the at least one RF transistor being controllable to vary attenuation of the attenuation circuit;
 at least one control circuit coupled to the at least one RF transistor to provide a control voltage to control operation of the RF transistor, the control circuit comprising:
  a first sub-circuit including:
   a first input port to accept a reference voltage; and
   a second input port to accept a reference current;
   at least one of the reference voltage or the reference current being adjustable; and
  a second sub-circuit including:
   a plurality of stacked transistors coupled between the first sub-circuit and ground; and
   a resistor ladder coupled between the first sub-circuit and an output port of the control circuit;
  the first sub-circuit being coupled to the plurality of stacked transistors to provide the reference current to flow through the plurality of stacked transistors and to set a total voltage drop across the plurality of stacked transistors equal to the reference voltage;
  the first sub-circuit being coupled to the resistor ladder to set a total voltage drop across the resistor ladder equal to the reference voltage;
  each rung of the resistor ladder being coupled to control an operating voltage of a respective one of the plurality of stacked transistors, to cause each stacked transistor to operate with similar control conditions;
  the output port of the control circuit being coupled to one of the plurality of stacked transistors to provide the control voltage set by a voltage drop across one of the plurality of stacked transistors.

12. The variable attenuator of claim 11, wherein the first sub-circuit of the control circuit comprises:
 a current mirror;
 a first operational amplifier (op amp) having a positive input port coupled to the first input port, and an output port coupled to a negative input port of the first op amp in a first feedback loop via the current mirror; and
 a second op amp having a positive input port coupled to the second input port, a negative input port coupled to the first input port, and an output port coupled to the output port of the control circuit, the output port of the second op amp also being coupled to the positive input port of the second op amp in a second feedback loop via the second sub-circuit;

wherein the stacked transistors are coupled between the positive input port of the second op amp and ground; and wherein the resistor ladder is coupled between an output of the current mirror and the output port of the control circuit.

13. The variable attenuator of claim 11, wherein the attenuation circuit has a T-type configuration.

14. The variable attenuator of claim 11, wherein the attenuation circuit has a Π-type configuration.

15. The variable attenuator of claim 11, wherein, in the control circuit, the plurality of stacked transistors are field-effect transistors (FETs), and wherein the similar control conditions comprise: voltages between a gate and a source of each stacked transistor are substantially equal, and voltages between a drain and the source of each stacked transistor are substantially equal.

16. The variable attenuator of claim 15, wherein, in the control circuit, the plurality of stacked transistors are metal-oxide semiconductor FETs (MOSFETs), and wherein the similar control conditions further comprise: voltages between a bulk and the source of each stacked transistor are substantially equal.

17. The variable attenuator of claim 15, wherein at least one of the reference voltage or the reference current is adjustable to enable the voltage between the drain and the source of each stacked transistor to be close to zero, and current flow across each stacked transistor to be close to zero.

18. The variable attenuator of claim 11, wherein the plurality of stacked transistors are bipolar transistors, and wherein the similar control conditions comprise: voltages between a collector and an emitter of each transistor are substantially equal, and voltages between a base and the emitter of each transistor are substantially equal.

19. The variable attenuator of claim 11, wherein at least one of the reference current or reference voltage is adjustable to enable the current flow across each stacked transistor to match current flow across the RF transistor and the voltage drop across each stacked transistor to match voltage drop across the RF transistor, to achieve resistance matching with the RF transistor.

20. An apparatus comprising:
a transceiver configured to receive or transmit signals; and
a variable attenuator configured to attenuate the received or transmitted signals, the variable attenuator including:
an attenuation circuit including at least one radio frequency (RF) transistor, the at least one RF transistor being controllable to vary attenuation of the attenuation circuit;
at least one control circuit coupled to the at least one RF transistor to provide a control voltage to control operation of the RF transistor, the control circuit comprising:
a first sub-circuit including:
a first input port to accept a reference voltage; and
a second input port to accept a reference current;
at least one of the reference voltage or the reference current being adjustable; and
a second sub-circuit including:
a plurality of stacked transistors coupled between the first sub-circuit and ground; and
a resistor ladder coupled between the first sub-circuit and an output port of the control circuit;
the first sub-circuit being coupled to the plurality of stacked transistors to provide the reference current to flow through the plurality of stacked transistors and to set a total voltage drop across the plurality of stacked transistors equal to the reference voltage;
the first sub-circuit being coupled to the resistor ladder to set a total voltage drop across the resistor ladder equal to the reference voltage;
each rung of the resistor ladder being coupled to control an operating voltage of a respective one of the plurality of stacked transistors, to cause each stacked transistor to operate with similar control conditions;
the output port of the control circuit being coupled to one of the plurality of stacked transistors to provide the control voltage set by a voltage drop across one of the plurality of stacked transistors.

21. The apparatus of claim 20, wherein the first sub-circuit of the control circuit of the variable attenuator comprises:
a current mirror;
a first operational amplifier (op amp) having a positive input port coupled to the first input port, and an output port coupled to a negative input port of the first op amp in a first feedback loop via the current mirror; and
a second op amp having a positive input port coupled to the second input port, a negative input port coupled to the first input port, and an output port coupled to the output port of the control circuit, the output port of the second op amp also being coupled to the positive input port of the second op amp in a second feedback loop via the second sub-circuit;
wherein the stacked transistors are coupled between the positive input port of the second op amp and ground; and
wherein the resistor ladder is coupled between an output of the current mirror and the output port of the control circuit.

22. The apparatus of claim 20, wherein at least one of the reference current or reference voltage is adjustable to enable the current flow across each stacked transistor to match current flow across the RF transistor and the voltage drop across each stacked transistor to match voltage drop across the RF transistor, to achieve resistance matching with the RF transistor.

* * * * *